United States Patent [19]
Streifer et al.

[11] 3,970,958
[45] July 20, 1976

[54] ELECTRICALLY PUMPED, SOLID-STATE DISTRIBUTED FEEDBACK LASER WITH PARTICULAR GRATING SPACING

[75] Inventors: William Streifer, Palo Alto; Donald R. Scifres, Los Altos; Robert D. Burnham, Los Altos Hills, all of Calif.

[73] Assignee: Xerox Corporation, Stamford, Conn.

[22] Filed: Oct. 15, 1974

[21] Appl. No.: 515,121

[52] U.S. Cl. .................. 331/94.5 C; 331/94.5 H; 350/96 WG
[51] Int. Cl.² ..................................... H01S 3/082
[58] Field of Search ............... 331/94.5; 350/96 WG

[56] References Cited
UNITED STATES PATENTS 3,868,589  2/1975  Wang ............................ 331/94.5 C

OTHER PUBLICATIONS

Harris et al., Distributed Feedback Semiconductor Injection Laser, IBM Tech. Discl. Bull., vol. 16, No. 1 (June 1973) pp. 171 and 172.

*Primary Examiner*—William L. Sikes
*Attorney, Agent, or Firm*—John E. Beck; Terry J. Anderson; Leonard Zalman

[57] ABSTRACT

A distributed feedback, (DFB) electrically pumped diode laser in which the spacing of the periodic structure within the diode is selected to optimize the interaction between the periodic structure and the electromagnetic waves in the diode laser. The degree to which the waves interact with the periodic structure is described mathematically by a coupling constant K, with larger values of K corresponding to lower gains required to produce laser operation. It is shown that in DFB diode lasers higher order transverse modes have a higher coupling constant K with the periodic structure than does the lowest order transverse mode and thus the higher order transverse modes will lase more easily than the lowest order transverse mode.

8 Claims, 4 Drawing Figures

A SINGLE HETEROJUNCTION DIODE (DFB) LASER

ELECTRICALLY PUMPED, SOLID-STATE DISTRIBUTED FEEDBACK LASER WITH PARTICULAR GRATING SPACING

BACKGROUND OF THE INVENTION

Solid-state laser devices have been suggested for use in integrated optical circuits. One such laser that can be electrically pumped is described in copending U.S. Patent Application Ser. No. 499,671, filed Aug. 22, 1974, and entitled "Electrically Pumped, Solid-State Distributed Feedback Laser." In that laser a grating or physical periodic structure is provided in, or adjacent to, a light wave guide layer. The spacing of the perturbations of the periodic structure are selected to be an integer number of half wavelengths of the desired light frequency within the laser, such that the perturbations produce Bragg Scattering which couples and reinforces right and left light waves traveling through the light guiding layer in a coherent manner such that reflections are in phase, thus allowing laser operation in the absence of discrete end mirrors. The degree to which the right and left going waves interact with the perturbations is described mathematically by a coupling constant, K. The magnitude of this constant affects the length of the laser gain region and/or the value of gain required for laser operation with larger values of K corresponding to shorter lengths L and/or lower gains.

As noted in the aforementioned application, the spacing of the perturbations of the periodic structure is calculated by utilizing the wavelength of the light frequency desired in free space, i.e., outside of the laser device, in accordance with the reflection formula $\Lambda = m \lambda_0/2n$ where $\Lambda$ is the spacing of the periodic structure, m is the Bragg diffraction order, $\lambda_o$ is the free space lasing wavelength, and n is the refractive index of the light guiding layer. With the formulated spacing, laser operation is often difficult to achieve. The reason for this difficulty is believed to reside in the fact that the gratings usually do not produce large values of the coupling constant for the lowest order transverse mode. That mode, which is most tightly confined to the light guiding layer, has a propagation constant and wavelength within the laser, which is aproximately $\lambda_o/n$ and therefore satisfies the reflection formula. However, in structures utilizing trapped or confined waves, such as the light guiding layer of a DFB laser, transverse modes exist which have propagation constants differing greatly from free space values. These higher order transverse modes have a higher coupling constant with the periodic structure and thus, they will lase easily, compared with the lowest order transverse mode.

It is also desirable in many applications to have a single mode output from a distributed feedback laser. Single mode operation is difficult to effect if the transverse mode spacing is not comparable to the spectral width of the gain of the laser.

OBJECTS OF THE INVENTION

It is therefore an object of the invention to provide an improved distributed feedback laser.

It is a further object of the present invention to optimize the spacing of the periodic structure of a distributed feedback laser.

SUMMARY OF THE INVENTION

In accordance with the invention, the foregoing objects are achieved by selecting the periodicity of the periodic structure to optimize the value of the coupling constant, K. This optimization will increase the interaction between the left and right going waves in the light guiding layer, thereby reducing the length of gain region and/or the value of gain needed for laser operation. Also, by regulating the coupling constant, single, higher order mode operation is more easily obtained since higher order modes have substantially larger coupling constants than do lower order modes and can be generated using grating periodicities which will not support adjacent modes.

DETAILED DESCRIPTION OF THE INVENTION

As noted, in a distributed feedback laser it is important to optimize the periodicity of the periodic structure since this structure serves to couple the right and left going waves in the light guiding layer. To achieve this optimization the coupling coefficients and the propagation constants of a particular laser mode must be calculated. The coupling constants, denoted by K, determine the net gain and/or length of the laser structure required to initiate lasing, and the propagation constants, denoted by B, determine the transverse mode separation and, more importantly, the required periodicity of the grating structure of the distributed feedback laser.

Figure 1:
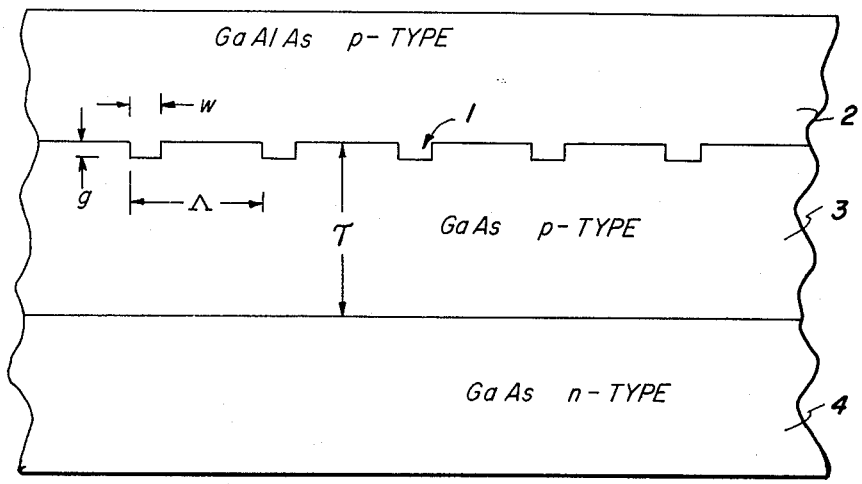
FIG. 1 is a cross-sectional view of a single heterojunction SH DFB laser according to the invention.

Reference is now made to FIG. 1 which shows a single heterojunction distributed feedback laser. The periodic perturbation is provided by the grating 1 of the p-type Ga Al As region 2 extending into the active gain p-type Ga As region 3 defined on the other side by n-type Ga As region 4. The refractive indicies of the regions 2, 3 and 4 can be 3.4, 3.6 and 3.58, respectively. The height g and width w of the grating teeth are shown in FIG. 1, as is the thickness $\tau$ of region 3.

To determine the optimal periodicity, the propagation constants B are calculated for the modes that can propagate in the device of FIG. 1. The calculations of B are in accordance with those of A. Yariv (see IEEE J. Quantum Electronics, QE-9,919 (1973) ). According to Yariv, the field component of the TE modes in the device of FIG. 1 obeys the wave equation $$\nabla^2 E_y = \frac{n_i^2}{c^2} \frac{\delta^2 E_y}{\delta t^2}, i = 1,2,3 \qquad (1)$$

and applying equation (1) to the regions of the device of FIG. 1 using boundary conditions set forth by Yariv, yields equations $$h = (n_2^2 k^2 - B^2)^{1/2} \qquad (1a)$$

$$q = (B^2 - n_1^2 k^2)^{1/2} \qquad (1b)$$

$$p = (B^2 - n_3^2 k^2)^{1/2} \qquad (1c)$$

and $$\tan(h\tau) = h(p+q)/(h^2 - pq). \qquad (1d)$$

where $k=W/c$. The propagation constants B of the TE modes of the device of FIG. 1 are obtained by solving equations (1a)–(1d). As can be seen from equations (1a)–(1d), the three region structure of FIG. 1, without grating considerations, determines the values of B. Thus, for a given frequency W each mode has a particular guide wavelength. For example, in Table I, the value of B for different TE modes in a single heterojunction diode with $n_1 = 3.4$, $n_2 = 3.6$, and $n_3 = 3.58$ as a function of thickness $t$ for $W = 2.2176 \times 10^{15}$ rad/sec (which corresponds to a free-space wavelength of $\lambda_o = 8500$ A) are listed, with the values computed by solving equations (1a)–(1d) by conventional methods.

Figure 2:
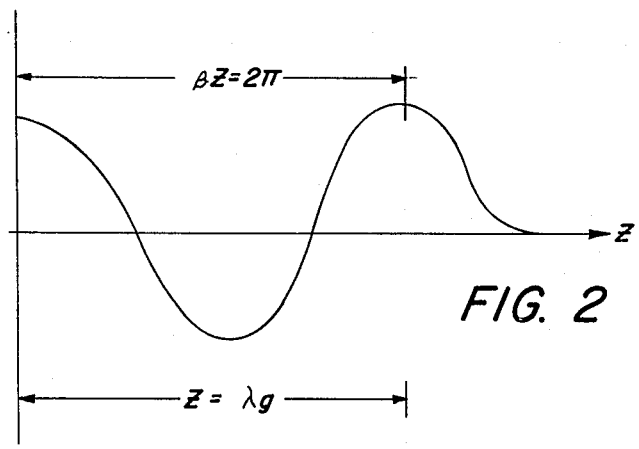
FIG. 2 is a plot illustrating the relationship of propagation constant and guide wavelength.

To determine $\lambda_g$ the wavelength for each mode in the guiding layer 3, we look to the propagation of the lasing waves, as shown in FIG. 2, which has a real component according to the relationship $$Re\{e^{iBz} e^{-iwt}\} = \cos(BZ - wt). \quad (2)$$

Since, when $Bz$ changes by $2\pi$ the cosine function repeats itself, which is the definition of a wavelength, i.e. $z$ has changed by $\lambda g$ when $BZ$ changes by $2\pi$, we have $$B\lambda_g = 2\pi. \quad (3)$$

From equation (3) we get the family of relationships between $B^{(n)}$ and $\lambda_g^{(n)}$ as follows: $B^{(1)} = 2\pi/\lambda_g^{(1)}$, $B^{(2)} = 2\pi/\lambda_g^{(2)}$, $B^{(3)} = 2\pi/\lambda_g^{(3)}$, $B^{(4)} = 2\pi/\lambda_g^{(4)}$, $B^{(5)} = 2\pi/\lambda_g^{(5)}$ and so on where $\lambda_g^{(n)}$ is the light wavelength in the light guiding layer. Since $$\lambda_g = 2\Lambda/m \quad (4)$$

where m is the Bragg diffraction order, and $\Lambda$ is the periodicity, equations (3) and (4) yield $$\Lambda = \pi m/B, \quad (5)$$

which is the required periodicity of the grating of the device of FIG. 1 where $m$ is the Bragg diffraction order. The values of $\lambda_g$ and $\Lambda$ for various modes, various thicknesses (t) of the guiding layer 2 and $\lambda_o = 8500$ A are given in Table I.

Figure 3:
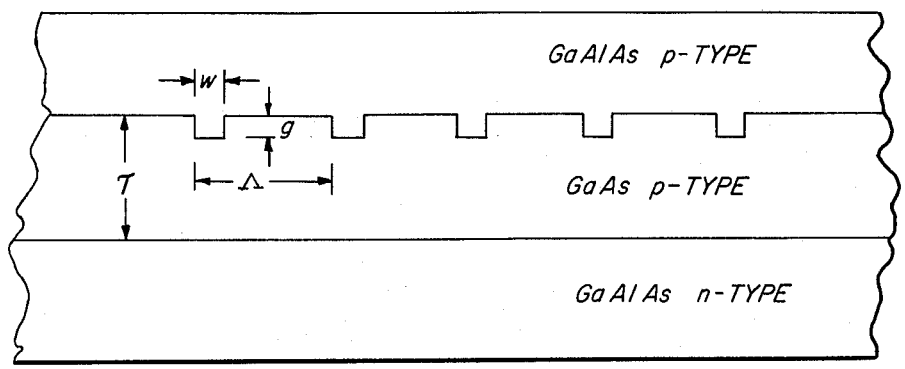
FIG. 3 is a cross-sectional view of a double heterojunction DH DFB laser according to the invention.

Considering now a double heterojunction diode with $n_1 = 3.4$, $n_2 = 3.6$, and $n_3 = 3.4$ and $t = 2\mu m$, as shown in FIG. 3. Equations (1a)–(1b) are uses to solve for values of B. Values of $\lambda_g$ and $\Lambda$ are then calculated for modes 1–6 using equations (3) and (4) for $\lambda_o = 8500$ A, as shown in Table II.

TABLE I

| t(μm) | Mode Number | B (μm⁻¹) | λg (μm) | Λ(A) |
|---|---|---|---|---|
| 0.5 | 1 | 26.466 | 0.2374 | 3561 |
| 1.0 | 1 | 26.530 | 0.2368 | 3552 |
| 1.5 | 1 | 26.564 | 0.2365 | 3548 |
| 2.0 | 1 | 26.581 | 0.2364 | 3546 |
|  | 2 | 26.497 | 0.2371 | 3557 |
| 2.5 | 1 | 26.590 | 0.2363 | 3544 |
|  | 2 | 26.530 | 0.2368 | 3552 |
| 3.0 | 1 | 26.596 | 0.2362 | 3544 |
|  | 2 | 26.551 | 0.2366 | 3550 |
|  | 3 | 26.481 | 0.2373 | 3559 |

TE MODE PROPAGATION CONSTANTS IN A SH DIODE FOR VARIOUS LAYER THICKNESS AND $\lambda_o = 8500$A.

TABLE II

| Mode Number | B (μm⁻¹) | λg (μm) | Λ(A) |
|---|---|---|---|
| 1 | 26.574 | 0.2364 | 3547 |
| 2 | 26.462 | 0.2374 | 3562 |
| 3 | 26.276 | 0.2391 | 3587 |
| 4 | 26.017 | 0.2415 | 3623 |
| 5 | 25.691 | 0.2446 | 3669 |
| 6 | 25.314 | 0.2482 | 3723 |

TE MODE PROPAGATION CONSTANTS IN A DH DIODE FOR $t = 2\mu m$ $\lambda_o = 8500$A.

Clearly, for particular values of $\Lambda$ each of the transverse modes resonate at a different free-space wavelength $\lambda_o$. Since the actual grating period $\Lambda$ is fixed in a particular laser, it is important to compute $\lambda_o$ given $\Lambda$ and the Bragg diffraction order m. Values of $\lambda_o$ for three different grating spacing, i.e., $\Lambda = 3547$A, $\Lambda = 3623$A, and $\Lambda = 3669$A are listed in Table III. The values of $\lambda_o^{(i)}$ are arrived at as follows:

1. Assume a trial value of the free-space wavelength $\lambda_o$ denoted by $\lambda_o^{(t)}$. A good trial value is given by $$\lambda_o^t = 2 \Lambda n_2/m.$$

2. Using $\lambda_o^t$ calculated the transverse mode propagation constants from Eqs. (1a)–(1d). Denote the constant for the $i^{th}$ mode by $B^{(i)}$.

3. Calculate the guide wavelength $$\lambda_g^{(i)} = 2\pi/B^{(i)}$$

4. Since $\lambda_g^{(i)}$ is the guide wavelength having assumed a free-space wavelength $\lambda_o^t$ and since the actual guide wavelength must be almost exactly $2\Lambda/m$, the actual free-space wavelength of the $i^{th}$ transverse mode $\lambda_o^{(i)}$ is given by $$\frac{\lambda_o^{(i)}}{\lambda_o^t} = \frac{2\Lambda/m}{\lambda_g^{(i)}}.$$

5. To obtain greater accuracy one can repeat steps (2)–(4) with $\lambda_o^t = \lambda_o^{(i)}$, but we usually find this to be unnecessary as is illustrated by the example below.

Example

Let $\Lambda = 3500$A and $m = 3$ for the DH structure shown in FIG. 3 with $t = 2\mu m$, $n_1 = n_3 = 3.4$ and $n_2 = 3.6$.

1. Assume $\lambda_o^t = 8500$A. Note that $2\Lambda n_2/m \approx 8400$A.
2. The calculation gives $B^{(1)} = 26.57381$ μm as listed in Table II with only 26.574 retained.
3. $\lambda_g^{(1)} = 2\pi/26.57381 = 2364.4277$A.
4. Since $2\Lambda/m = 2333.3333$A.

$$\lambda_o^{(1)} = \frac{2333.3333}{2364.4277} \times 8500 = 8388.2172\text{A}$$

5. Set $\lambda_o^t = 8388.2$A
2'. The calculation gives $B^{(1)} = 26.9288\mu m$
3'. $\lambda_g^{(1)} = 2333.2516$A 4'. $\lambda_o^{(1)} = \frac{2333.3333}{2333.2516} \times 8388.2 = 8388.4936$A.

which is not a significant change in the calculated value of $\lambda_o^{(1)}$.

Referring to Table III, we note that for $\Lambda = 3623A$ the modes adjacent to the ones resonant at $\lambda_o = 8500A$ are 8584A and 8393A which are shifted so far from the main resonant frequency that they are outside of the spectral width of the gain and thus experience substantially reduced net gain. The same is true for the modes adjacent $\lambda_o = 8500A$ for $\Lambda = 3669A$. Since the higher modes resonant at greater frequency separation than the lower order modes, and the adjacent modes are outside the spectral width of the gain, single mode operation is more easily obtained.

TABLE III

| Mode Number | $\lambda_o(A)$ $\Lambda=3547A$ | $\lambda_o(A)$ $\Lambda=3623A$ | $\lambda_o(A)$ $\Lambda=3669A$ |
|---|---|---|---|
| 1 | 8500 | 8682 | 8792 |
| 2 | 8464 | 8645 | 8755 |
| 3 | 8405 | 8584 | 8694 |
| 4 | 8322 | 8500 | 8608 |
| 5 | 8218 | 8393 | 8500 |
| 6 | 8097 | 8270 | 8375 |

FREE-SPACE WAVELENGTHS FOR VARIOUS GRATING PERIODS IN A DH STRUCTURE.

Figure 4:
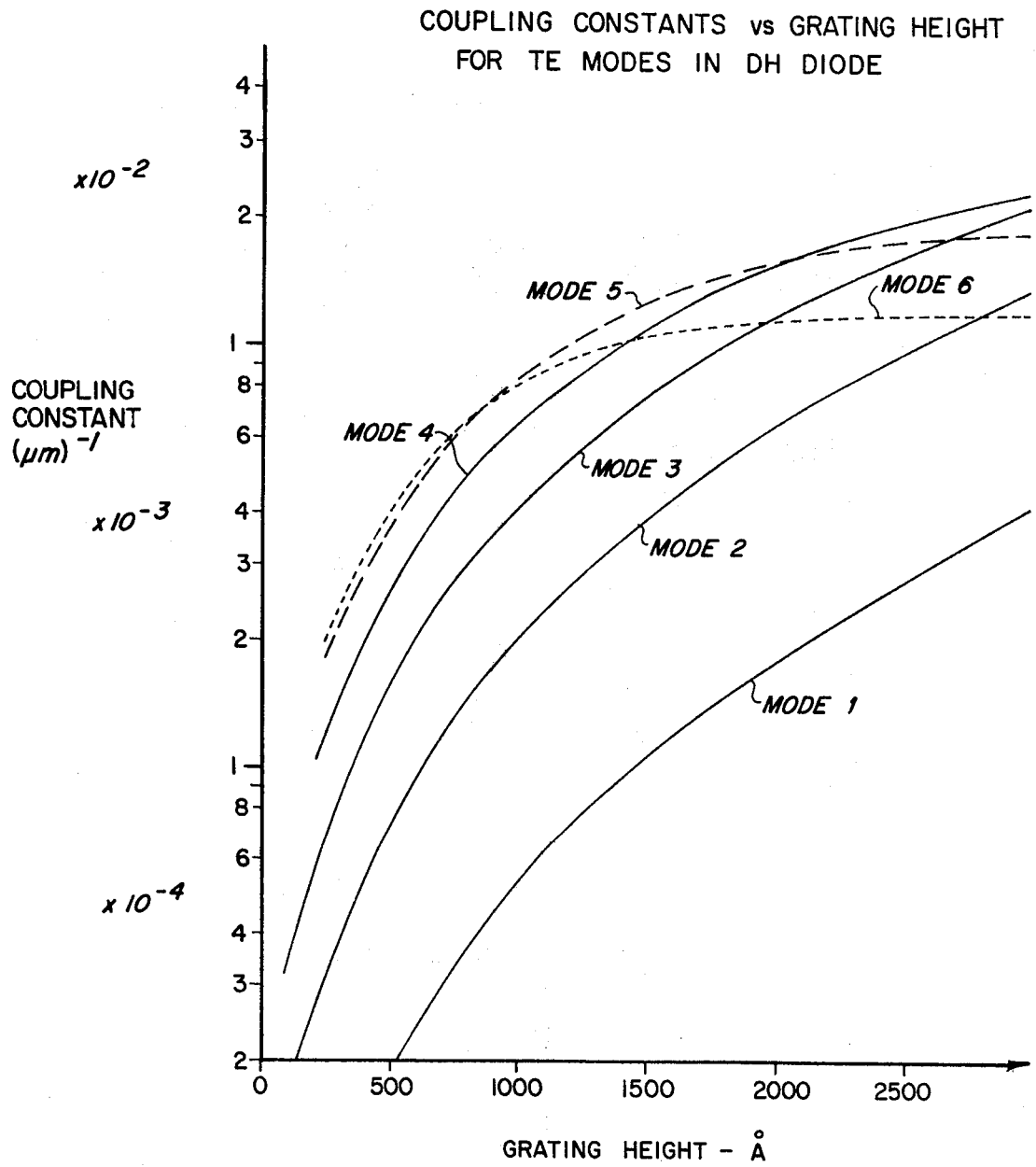
FIG. 4 is a plot of grating height v. coupling constants for different modes of the double heterojunction structure specified.

Regarding single mode operation, reference is had to FIG. 4 which is a plot of K (the coupling coefficient) vs. grating height for propagated modes of a double heterojunction diode geometry with $n_1=n_2=3.4$, $n_2=3.6$, $\tau=2mm$, $W=875A$, and $\lambda = 3500A$. The coupling constant K is calculated for a rectangular grating using the equation $$K = \frac{k^2(n_1^2 - n_2^2)}{m\pi B} \frac{h^2}{(h^2+q^2)(t+q^{-1}+p^{-1})} \frac{\sin(m\pi W_o/\Lambda)}{2}$$
$$g + \frac{\sin(2gh)}{2h} + \left\{ \frac{q}{h^2}[1-\cos(2gh)] + \frac{q^2}{h^2} g - [\frac{\sin(2gh)}{2h}] \right\}$$

Generally $K$ increases with mode number, which reflects the fact that the higher modes have larger relative amplitudes in the vicinity of the grating and hence interact more with the grating. Also $K$ increases with the grating height, g; however, when g approximates the zero of a particular mode $d K/d g = O$. This occurs for the 6th mode at $g \approx 2500A$; K does increase for that mode with further increases in g and in fact $K_6$ exceeds $K_5$ for $g \approx 4500A$. Clearly, $K_4$, $K_5$, and $K_6$ are substantially larger than $K_1$ or $K_2$ for small value of g. For example, for $g = 1500A$, $K_4$ and $K_5$ are over an order of magnitude greater than $K_1$. Thus, referring to Table II, a double heterojunction diode laser having $t = 2\mu m$ and $\lambda_o = 8500A$ will have a substantially lower threshold with $\Lambda = 3623A$ or $3669A$ then with $\Lambda = 3547A$ since the coupling coefficients are greater for the latter spacings than for the former spacing. Thus, it is shown for TE modes that a particular mode will oscillate at a lower pumping threshold if the spacing of the grating is chosen to optimize oscillations and the coupling coefficient of that mode.

Identical calculations have been carried out for TM modes with very similar results. Generally, K for TM modes is slightly smaller than that for corresponding TE modes, but the differences are not significant. It should also be noted that the foregoing calculations are based on perturbations rather than an exact solution of the boundary value problem (with grating present).

In conclusion it has been shown that higher order transverse modes in guided wave structures often have much larger coupling coefficients than do lower modes. Grating spacings required to resonate the higher order transverse modes have been calculated and these modes were shown to have large separations in frequency, thus facilitating single mode operation. The results indicate that it is often desirable to fabricate the DFB grating of a guided wave laser at a period which differs substantially from that required to resonate the lowest order mode, and calculated in accordance with the standard formula $\Lambda = m\lambda/2n$.

We claim:

1. An electrically pumped, distributed feedback, diode laser for producing a single, high order mode laser output beam having a selected free space wavelength comprising:

a plurality of layers of semiconductor material, one of said layers of semiconductor material being a light wave guide layer and at least one other of said layers of semiconductor material bordering said light wave guide layer, said light wave guide layer being of a material having an index of refraction greater than the material of said at least one other layer, said light wave guide layer and a layer in contact with said light wave guide layer being doped such that a rectifying junction is formed at the interface therebetween, a periodic structure at the interface between two of said plurality of layers of semiconductor material, said periodic structure having a periodicity such that the free space wavelength of each of the higher order modes immediately adjacent said single, higher order mode producing said selected free space wavelength is outside of the spectral width of the gain produced by said periodic structure, whereby only light of said selected free space wavelength experiences a net gain in said laser and said laser output beam is substantially only at said selected free space wavelength, and means for forward biasing said rectifying junction to produce an injection of minority carriers into said light wave guide layer to produce said laser output beam having said selected free space wavelength.

2. The laser of claim 1 wherein said periodic structure has a periodicity of 3623A and said selected free space wavelength is 8500A corresponding to the fourth laser mode.

3. The laser of claim 1 wherein said periodic structure has a periodicity of 3669A and said selected free space wavelength is 8500A corresponding to the fifth laser mode.

4. An electrically pumped, distributed feedback, diode laser for producing a single, higher order mode laser output beam having a selected free space wavelength comprising:

a plurality of a layer of semiconductor material, one of said layers of semiconductor material being a light wave guide layer, said light wave guide layer being bordered on one surface by a first layer of semiconductor material and being bordered on another surface by a second layer of semiconductor material, said light wave guide layer being of a material having an index of refraction greater than the material of both said first layer and said second layer, said light wave guide layer and said first layer being doped such that a rectifying junction is formed at the interface therebetween, a periodic structure at the interface between two of said plurality of layers, said periodic structure having a periodicity such that the free space wavelength of each of the higher order modes immediately adjacent said single higher order mode producing said selected free space wavelength is outside of the spectral width of the gain produced by said periodic structure, whereby only light of said selected free space wavelength experiences a net gain and said laser output beam is substantially only at said selected free space wavelength, and means for forward biasing said rectifying junction to produce an injection of minority carriers into said light wave guide layer to produce said laser output beam having said selected free space wavelength.

5. The laser of claim 4 wherein said periodic structure is at the interface between said light wave guide layer and said second layer.

6. The laser of claim 4 wherein said light wave guide layer is GaAs and said first layer and said second layer are both GaAlAs.

7. The laser of claim 4 wherein said periodic structure has a periodicity of 3623A and said selected free space wavelength is 8500A corresponding to the fourth laser mode.

8. The laser of claim 4 wherein said periodic structure has a periodicity of 3669A and said selected free space wavelength is 8500A corresponding to the fifth laser mode.

* * * * *